(12) United States Patent
Yamaguchi et al.

(10) Patent No.: US 6,738,405 B1
(45) Date of Patent: May 18, 2004

(54) SEMICONDUCTOR LASER

(75) Inventors: Takeharu Yamaguchi, Tokyo (JP); Toshikazu Mukaihara, Tokyo (JP); Akihiko Kasukawa, Tokyo (JP)

(73) Assignee: The Furukawa Electric Co., Ltd., Tokyo (JP)

( * ) Notice: Subject to any disclaimer, the term of this patent is extended or adjusted under 35 U.S.C. 154(b) by 324 days.

(21) Appl. No.: 09/889,596
(22) PCT Filed: Nov. 16, 2000
(86) PCT No.: PCT/JP00/08067
§ 371 (c)(1), (2), (4) Date: Jul. 16, 2001
(87) PCT Pub. No.: WO01/37387
PCT Pub. Date: May 25, 2001

(30) Foreign Application Priority Data

Nov. 16, 1999 (JP) .......................... 11-325223

(51) Int. Cl.$^7$ ................................ H01S 5/00
(52) U.S. Cl. ..................................... 372/50
(58) Field of Search .................... 372/50, 45, 46, 372/96; 117/102

(56) References Cited

U.S. PATENT DOCUMENTS 5,577,064 A * 11/1996 Swirhun et al. ............ 372/50
5,616,177 A * 4/1997 Yamada ..................... 117/102

* cited by examiner

Primary Examiner—Quyen Leung
(74) Attorney, Agent, or Firm—Oblon, Spivak, McClelland, Maier & Neustadt, P.C.

(57) ABSTRACT

A semiconductor laser device (30) includes a layered structure formed on an n-type GaAs substrate (32) having a bandgap energy Eg1 and including an n-type AlGaAs cladding layer (34), an active layer (36) including a quantum-well structure of two layers InGaAs/GaAs having a bandgap energy Eg2 which is smaller than Eg1, a p-type AlGaAs cladding layer (38), and a p-type GaAs cap layer (40), which are consecutively epitaxially grown. The cap layer and the upper portion of the p-type cladding layer are formed as a stripe-shaped mesa structure. An SiN passivation film (42) is formed on the areas except for the top of the cap layer. On the exposed cap layer and the passivation layer a p-side electrode (44) is formed. On the bottom surface of the substrate an n-side electrode (46) including layered metal films of In/AuGe/Ni/Au is formed. An absorption medium layer is interposed between the GaAs substrate and the n-side electrode.

3 Claims, 6 Drawing Sheets

SEMICONDUCTOR LASER

FIELD OF THE INVENTION

The present invention relates to a semiconductor laser device, and more particularly to a semiconductor laser device which has a linear characteristic between injected current and optical output and achieves a stable oscillating spectrum, and which is particularly suitable for applications in optical communications.

BACKGROUND OF THE INVENTION

Semiconductor laser devices are commonly used for applications in optical communications. In particular, InGaAs 980 nm-band semiconductor laser devices are frequently used as the pumping light source for optical amplifiers in optical fiber communication systems.

The semiconductor laser device for use as the pumping light source for the optical amplifier, for example, is required to have a stable, optical output and emission spectrum with respect to the injected current.

Specifically, the current versus light output characteristic is required to be linear in order to increase the reliability of the optical amplification operation, for example. It is also preferable that the emission spectrum is in the stable longitudinal multimode lasing for suppressing the influence of returned light.

Referring to FIG. 4, the structure of a conventional InGaAs 980 nm-band semiconductor laser device will be described. FIG. 4 is a sectional view showing the structure of the conventional InGaAs 980 nm-band semiconductor laser device.

As shown in FIG. 4, the conventional InGaAs 980 nm-band semiconductor laser device 10 has a layered structure including an n-type GaAs substrate 12 having a thickness of 100 µm. On the substrate, an n-type AlGaAs cladding layer 14 having a 2 µm film thickness, an active layer 16 having a quantum-well structure with a pair of InGaAs/GaAs, a p-type AlGaAs cladding layer 18 having a 2 µm film thickness, and a p-type GaAs cap layer 20 having a 0.3 µm film thickness are consecutively grown epitaxially.

Of this layered structure, the p-type cap layer 20 and the upper portion of p-type cladding layer 18 are formed as a stripe-shaped mesa structure having a 4 µm width.

Except for the top of p-type cap layer 20, a passivation film 22 implemented by an SiN film is formed on the side walls of the mesa structure and on the p-type cladding layer 18.

On top of the exposed p-type cap layer 20 and passivation film 22, a p-side electrode 24 including layered metal films of Ti/Pt/Au is formed. On the bottom surface of GaAs substrate 12 is formed an n-side electrode 26 including layered metal films of AuGe/Ni/Au.

Referring to FIGS. 5A to 5C, the process of manufacturing the above-mentioned conventional semiconductor laser device 10 will be described. FIGS. 5A to 5C are sectional views of the substrate during the respective steps of the fabrication of the conventional InGaAs 980 nm-band semiconductor laser device.

First, on the n-type GaAs substrate 12 are epitaxially formed, by MOCVD, the n-type AlGaAs cladding layer 14 having 2 µm film thickness, the active layer 16 with the quantum-well structure of the InGaAs/GaAs pair, the p-type AlGaAs cladding layer 18 having 2 µm film thickness, and the p-type GaAs cap layer 20 having 0.3 µm film thickness, in the recited order. Thus, the layered structure is formed as shown in FIG. 5A.

Then, the p-type cap layer 20 and the upper portion of p-type cladding layer 18 are etched to form the stripe-shaped mesa structure which is 4 µm in width, as shown in FIG. 5B.

After forming the SiN film 22 as the passivation film on the entire top surface of the wafer, the SiN film 22 is etched to expose the cap layer 20 as shown in FIG. 5C.

The entire top surface of the wafer is then covered with the Ti/Pt/Au layered metal films by evaporation, thereby forming the p-side electrode 24. The top surface of GaAs substrate 12 is polished to have a thickness of 100 µm, and thereafter layered metal films of AuGe/Ni/Au are evaporated on the entire top surface of the substrate. Thus, the semiconductor laser device 10 can be fabricated as shown in FIG. 4.

In the above-described conventional semiconductor laser device 10, the band-gap energy Eg1 of n-type GaAs substrate 12 is 1.41 eV and the band-gap energy Eg2 of active layer 16 is 1.27 eV. The relationship Eg1>Eg2 enables the light emitted from the active layer to propagate through the substrate.

If the polished bottom surface of GaAs substrate 12 of semiconductor laser device 10 is mirror-finished, the light that propagated through GaAs substrate 12 is reflected by the bottom surface of the substrate and recombined as reflected light with the light from the active layer, as shown in FIG. 6.

When the reflected light from the bottom surface of the substrate combines with the light from the active layer, there arise the following two problems.

The first problem is that a kink phenomenon appears in the current versus light output characteristic which, as shown in FIG. 7, adversely affects the linearity of the optical output with respect to the injected current. Such a kink phenomenon makes it impossible to maintain a stable APC (automatic power control) operation.

The second problem is that the influence of the returned light becomes large. As the reflected light from the bottom surface of the substrate combines with the light from the active layer, ripples appear in the emission spectrum at about 3 nm intervals, as shown in FIG. 8. This is a phenomenon due to the formation of a hybrid resonator formed by an ordinary Fabry-Pérot resonator and 22a and the substrate.

In such a case, a longitudinal mode is selected at a 3 nm spacing. As the injected current is varied, the selected wavelength shifts mainly by the thermal effect while maintaining the 3 nm mode spacing, thereby varying the output and resulting in a mode hopping noise which is observed as an excessive noise. The lasing mode becomes a single longitudinal mode due to the ripples, so that the tolerance against the returned light deteriorates.

SUMMARY OF THE INVENTION

Accordingly, it is an object of the invention to provide a semiconductor laser device in which the optical output and emission spectrum are stable with respect to the injected current.

The semiconductor laser device according to the present invention is directed to a semiconductor laser device in which an active layer having a band-gap energy Eg2 is epitaxially grown on a semiconductor substrate having a band-gap energy Eg1, where Eg1>Eg2, the device being characterized in that an absorption medium layer for absorbing laser light lased by the active layer is formed on the bottom surface of the semiconductor substrate.

The absorption medium layer may be formed in any manner; however, it is preferably formed by an alloying reaction between a metal electrode layer formed on the bottom surface of the semiconductor substrate and the semiconductor substrate because of the easiness of the process. More specifically, if the semiconductor substrate is a GaAs substrate, the absorption medium layer formed on the bottom surface of the semiconductor substrate is an InGaAs layer, which is formed by an alloying reaction between In and GaAs. Namely, the metal electrode layer formed on the bottom surface of the GaAs substrate includes an In layer adjacent to the bottom surface of the substrate, and the absorption medium layer is an InGaAs layer obtained, after the formation of the metal electrode layer on the bottom surface of the substrate, by effecting a thermal processing to alloy the In of the metal electrode layer with the GaAs of the substrate.

Thus, the semiconductor laser device according to the present invention has an absorption medium layer formed on the bottom surface of the substrate that absorbs the laser light lased by the active layer. As a result, although the laser light lased by the active layer passes through the semiconductor substrate from the active layer side of the substrate surface to the bottom surface of the substrate due to the band-gap energy Eg2 of the active layer being smaller than the band-gap energy Eg1 of the semiconductor substrate, the laser light can be absorbed by the absorption medium layer.

Because the amount of laser light reflected by the bottom surface of the semiconductor substrate can thus be reduced in the semiconductor laser device according to the invention, the linearity of the optical output with respect to the injected current can be maintained, the emission spectrum can be stabilized, and the lasing mode is unlikely to assume a single longitudinal mode.

PREFERRED EMBODIMENT OF THE INVENTION

Specifically, an embodiment of the present invention will be hereunder described in detail with reference to the accompanying drawings by way of an embodiment thereof.

Figure 1:
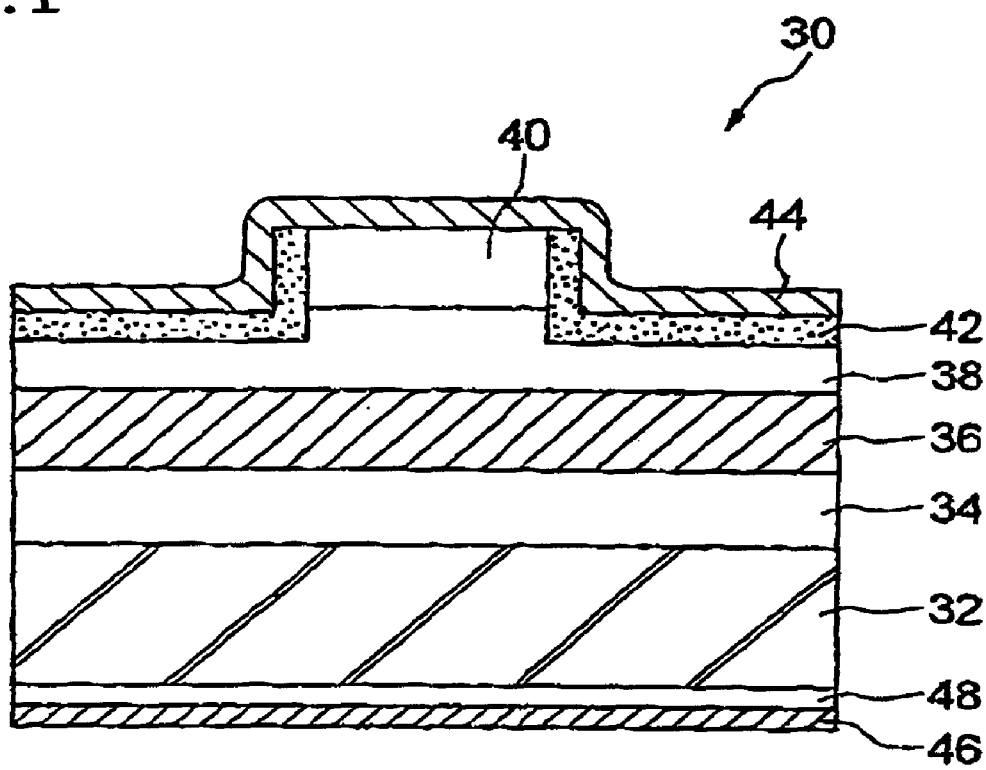
FIG. 1 is a sectional view showing the structure of a semiconductor laser device according to an embodiment of the invention.

Referring to FIG. 1, a semiconductor laser device 30 according to the present embodiment includes an n-type GaAs substrate 32 having a thickness of about 100 μm and a bandgap energy Eg1 of 1.41 eV, and a layer structure including: an n-type AlGaAs cladding layer 34 having a 2 μm film thickness; an active layer 36 having a quantum-well structure including two layers of InGaAs/GaAs and having a bandgap energy Eg2 of 1.26 eV, which is smaller than that of n-type GaAs substrate 32; a p-type AlGaAs cladding layer 38 having a 2 μm film thickness; and a p-type GaAs cap layer 40 having a 0.3 μm film thickness, which are consecutively epitaxially-grown on the substrate.

The p-type cap layer 40 and an upper portion of p-type cladding layer 38 are formed as a stripe-shaped mesa structure having a width of 4 μm.

A passivation film 42 made of SiN is formed on the sides of the mesa structure and on the p-type cladding layer 38 except for the top surface of the p-type cap layer 40. A p-side electrode 44 including layered metal films of Ti/Pt/Au is formed on the exposed p-type cap layer 40 and the passivation layer 42.

On the bottom surface of n-type GaAs substrate 32 is formed an n-side electrode 46 including layered metal films of In/AuGe/Ni/Au. An InGaAs layer 48 is interposed between the n-type GaAs substrate 32 and the n-side electrode 46 as the absorption medium layer for absorbing the laser light with the emission wavelength of the active layer 36.

The semiconductor laser device 30 according to the present embodiment can be manufactured, similarly to the conventional process, by using a MOCVD technique, for example, to form: the n-type AlGaAs cladding layer 44 having a 2 μm film thickness; the active layer 36 with the two-layer quantum-well structure of InGaAs/GaAs; the p-type AlGaAs cladding layer 38 having a 2 μm film thickness; and the p-type GaAs cap layer 40 having a 0.3 μm film thickness, which are consecutively grown on the n-type GaAs substrate 32 to form the layered structure.

Thereafter, the p-type cap layer 40 and the upper portion of p-type cladding layer 38 are etched to form the 4 μm-wide stripe-shaped mesa structure. The SiN film 42 as the passivation film is then formed on the entire upper surface of the substrate, and the SiN film 42 is etched to expose the p-type cap layer 40.

Then, the layered metal films of Ti/Pt/Au are evaporated on the entire upper surface of the substrate, thereby forming the p-side electrode 24. The bottom surface of GaAs substrate 32 is polished to have a thickness of 100 μm.

Subsequently, in the manufacture of the semiconductor laser device 30 according to the present embodiment, metal films of In/AuGe/Ni/Au are sequentially evaporated on the bottom surface of the substrate, thereby forming the n-side electrode 46 composed of the layered metal films.

The substrate on which the n-side electrode 46 is formed is then subjected to a heat processing at a temperature of 350° C. in a hydrogen ambient for 5 minutes. This causes an alloying reaction to take place between In of the layered metal films forming the n-side electrode 46 and GaAs of the n-type GaAs substrate 32. As a result, the InGaAs layer 48 having a film thickness of about 100 nm can be formed between the n-side electrode 46 and the n-type GaAs substrate 32.

In the semiconductor laser device 30 according to the present embodiment, the InGaAs layer 48 is formed on the bottom surface of n-type GaAs substrate 32 so that the InGaAs layer 48 serves as the absorption medium for the 980 nm emission wavelength and has a band-gap energy $Eg3$ of about 0.9 eV.

Although the laser light with the emission wavelength 980 nm lased by the active layer 36 passes through the n-type GaAs substrate 32 towards the bottom surface of the substrate from the active-layer side of the substrate, the passed laser light is absorbed by the InGaAs layer 48 before reaching the bottom surface of the substrate to be reflected, because the bandgap energy $Eg2$ of the active layer 36 is smaller than the bandgap energy $Eg1$ of the n-type GaAs substrate 32.

Thus, the amount of laser light reflected by the bottom surface of the n-type GaAs substrate 32 is reduced in the present embodiment. Accordingly, the linearity of the optical output with respect to the injected current can be maintained, the emission spectrum is stabilized, and the lasing mode is unlikely to assume a single longitudinal mode.

Figure 2:
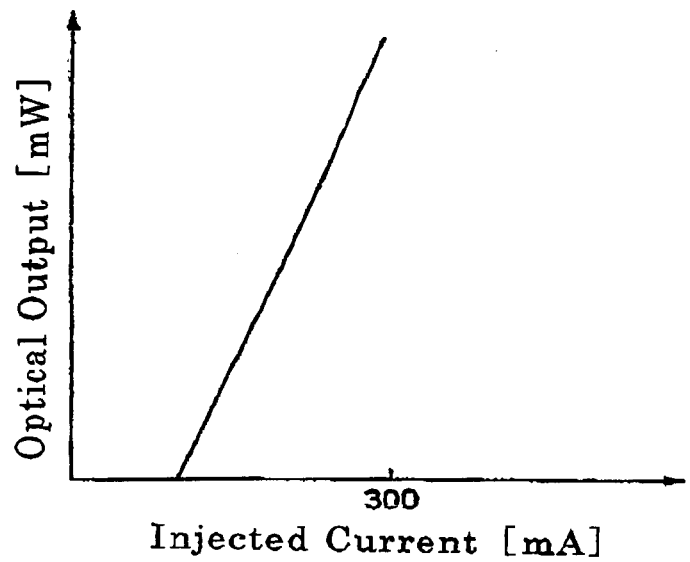
FIG. 2 is a graph showing the injected current versus optical output characteristic of the semiconductor device according to the embodiment.

An actual sample of the semiconductor laser device 30 according to the present embodiment was fabricated and subjected to the measurement of current versus optical output characteristic. The measurement of the device exhibited that current versus optical output characteristic was linear without kinks up to an injected current of 300 mA, as shown in FIG. 2.

Figure 3:
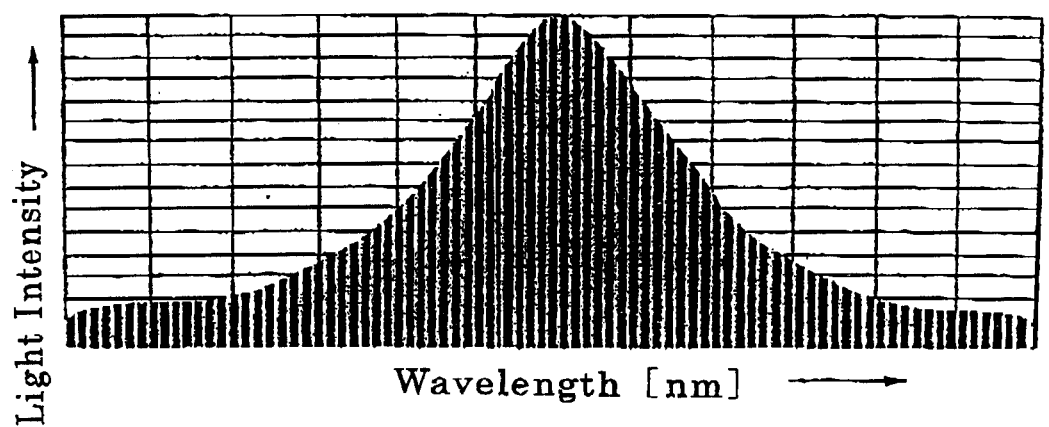
FIG. 3 is a chart showing the emission spectrum of the semiconductor laser device according to the embodiment.
Figure 4:
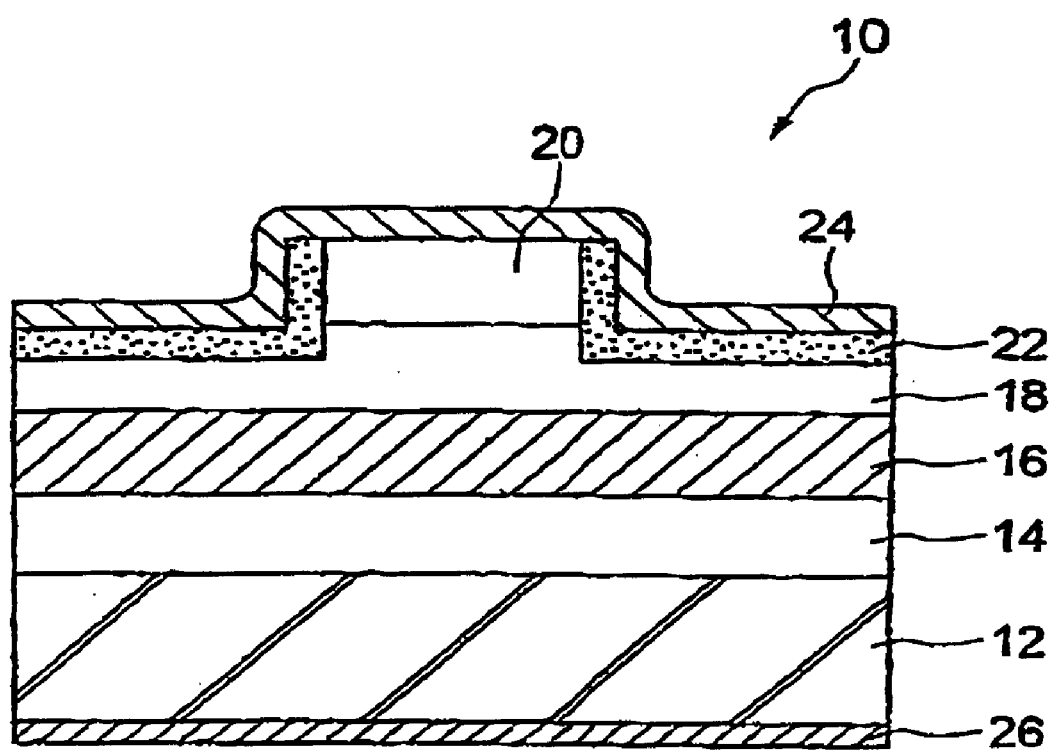
FIG. 4 is a sectional view showing a structure of a conventional InGaAs 980 nm-band semiconductor laser device.
Figure 5A:
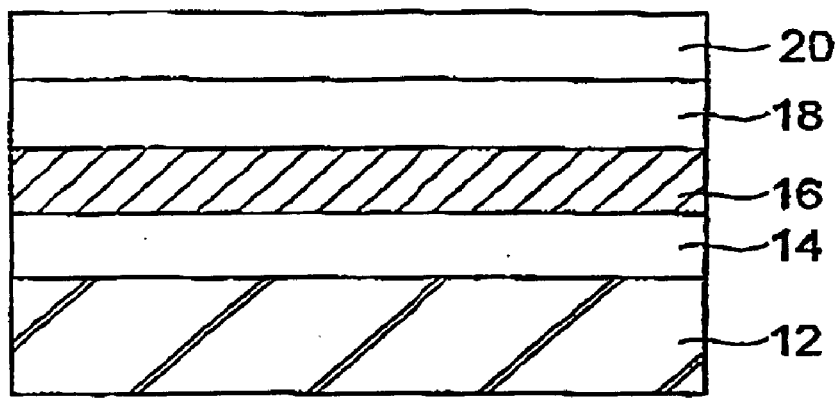
FIGS. 5A to 5C are sectional views of the substrate during the respective process steps in the manufacture of the conventional InGaAs 980 nm-band semiconductor laser device.
Figure 5B:
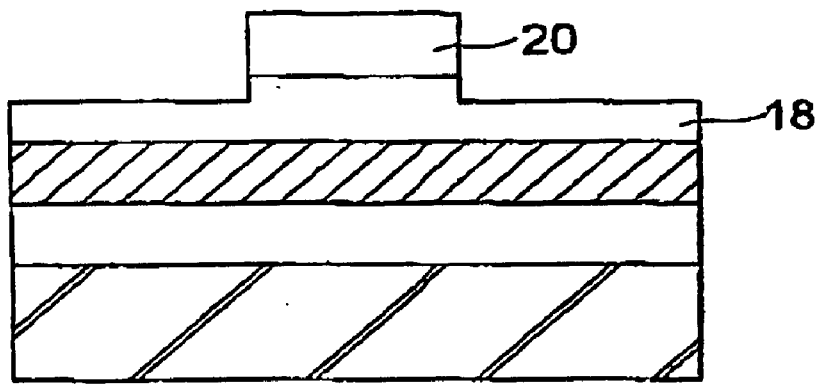
Figure 5C:
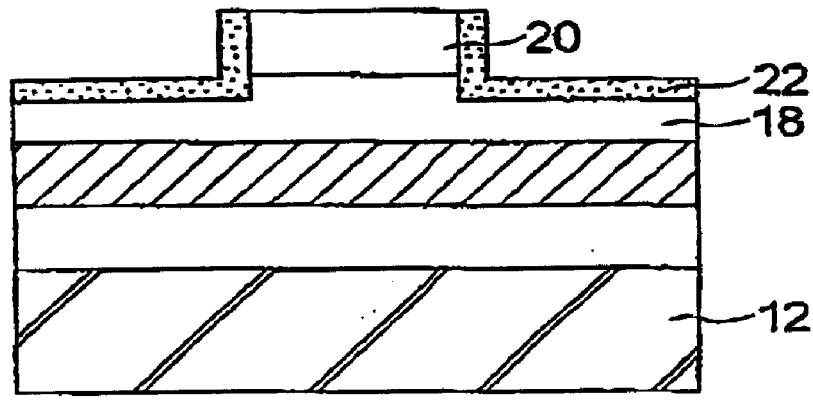
Figure 6:
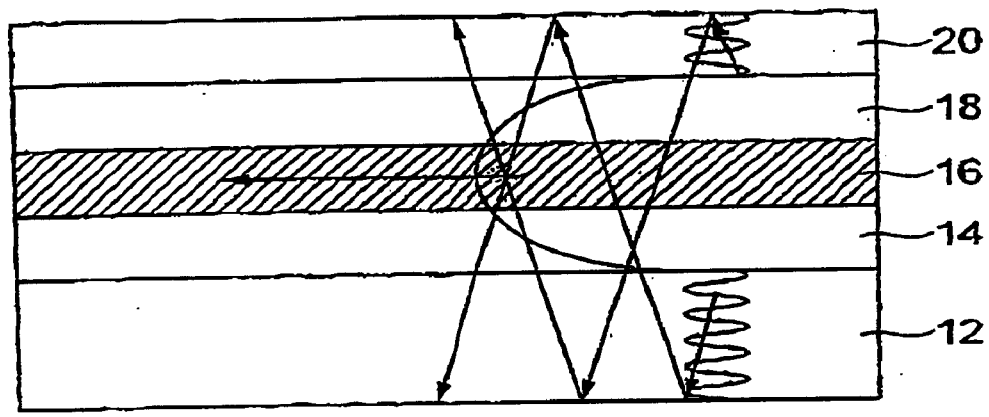
FIG. 6 is a schematic view for illustrating laser light propagating through the substrate and being reflected by the bottom surface of the substrate to recombine with the laser light from the active layer.
Figure 7:
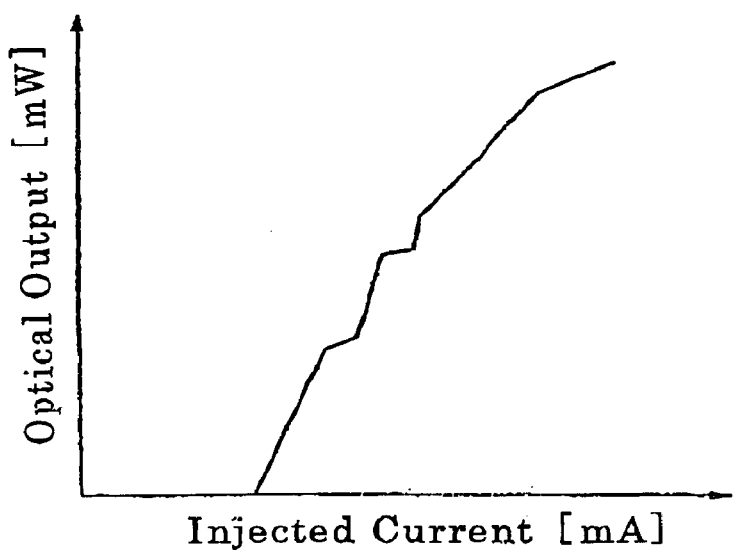
FIG. 7 is a graph showing the injected current versus optical output characteristic of the conventional semiconductor laser device.
Figure 8:
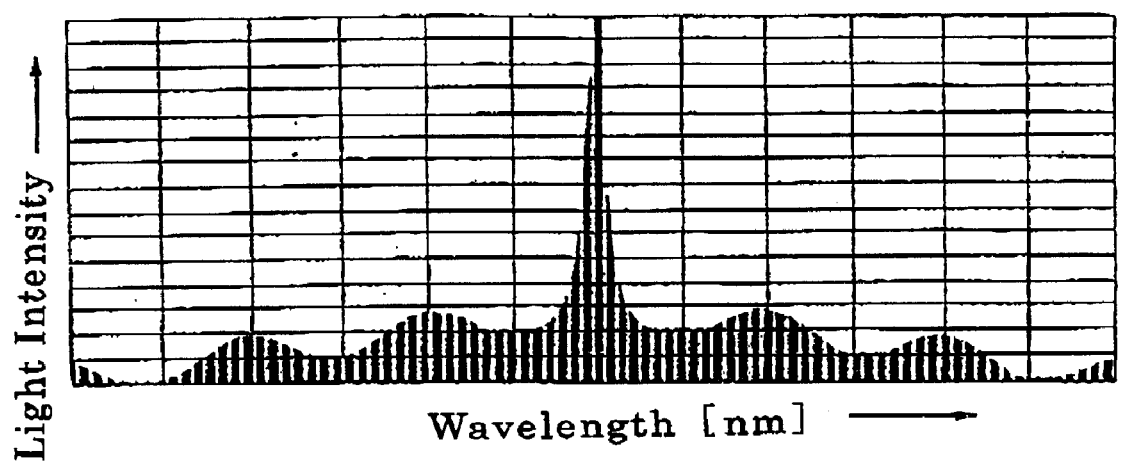
FIG. 8 is a chart showing the emission spectrum of the semiconductor laser device according to the embodiment.

The emission spectrum of the sample was observed to have no ripples as shown in FIG. 3, thereby confirming a longitudinal multimode lasing operation.

Although the present embodiment was described for the 980 nm-band laser, similar advantageous effects can be expected from lasers including active layers having band-gap wavelengths ranging from 1–3 $\mu$m bands (such as those with an active layer implemented by inGaNAs).

What is claimed is:

1. A semiconductor laser device comprising an active layer having a bandgap energy $Eg2$ and epitaxially grown on a semiconductor substrate having a bandgap energy $Eg1$, wherein $Eg1>Eg2$, characterized in that an absorption medium layer for absorbing laser light emitted by the active layer is formed on a bottom surface of the semiconductor substrate, wherein the absorption medium layer is formed by an alloying reaction between a metal electrode layer formed on the bottom surface of the substrate and the semiconductor substrate.

2. The semiconductor laser device according to claim 1, wherein the semiconductor substrate is a GaAs substrate and the absorption medium layer is an InGaAs layer.

3. The semiconductor laser device according to claim 2, wherein the metal electrode layer formed on the bottom surface of the GaAs substrate includes an In layer in contact with the bottom surface of the substrate, and wherein the absorption medium layer is an InGaAs layer formed by a heat processing for alloying the In of the metal electrode layer with the GaAs of the GaAs substrate after forming the metal electrode layer on the bottom surface of the substrate.

* * * * *